United States Patent [19]

Leslie

[11] Patent Number: 4,739,504

[45] Date of Patent: Apr. 19, 1988

[54] IC CHIP ERROR DETECTING AND CORRECTING METHOD

[75] Inventor: Duane W. Leslie, Pasadena, Calif.

[73] Assignee: Unisys Corp., Detroit, Mich.

[21] Appl. No.: 740,678

[22] Filed: Jun. 3, 1985

[51] Int. Cl.$^4$ ............................................. G06F 11/10
[52] U.S. Cl. ........................................ 371/37; 371/68
[58] Field of Search .......................... 371/37, 39, 40, 68

[56] References Cited

U.S. PATENT DOCUMENTS

| | | | |
|---|---|---|---|
| 3,781,796 | 12/1973 | Smith | 371/68 |
| 3,931,505 | 1/1976 | Sevcik | 371/68 |
| 4,020,460 | 4/1977 | Jones et al. | 371/68 X |
| 4,176,258 | 11/1979 | Jackson | 371/68 |
| 4,233,682 | 11/1980 | Liebergot et al. | 371/68 |
| 4,426,699 | 1/1984 | Tanaka et al. | 371/68 |
| 4,541,094 | 9/1985 | Stiffler et al. | 371/68 |
| 4,569,051 | 2/1986 | Wilkinson | 371/37 |

Primary Examiner—Charles E. Atkinson
Attorney, Agent, or Firm—Nathan Cass; Kevin R. Peterson; Edmund M. Chung

[57] ABSTRACT

A method employing two identical IC chips for providing error detecting and correcting operations on a plurality of input bits comprised of input data bits and input check bits, wherein a single one of the IC chips has an insufficient number of available outputs to provide all of the required outputs. The method includes applying the input data bits and the input check bits to the input terminals of each IC chip in an inverse manner relative to one another, and then performing the error detecting and correcting operations on each chip in accordance with an inversely symmetrical Hamming code. As a result, even though the same detecting and correcting operations are performed on each IC chip, they are performed in an inverse manner with respect to the input data and input check bits so that each IC chip is able to provide one-half of the required output bits.

7 Claims, 9 Drawing Sheets

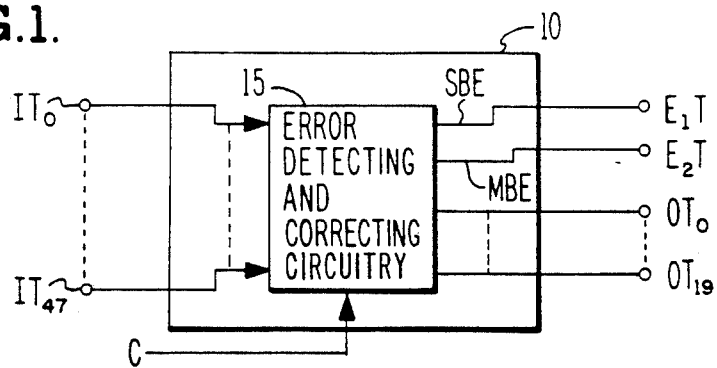
FIG.1.
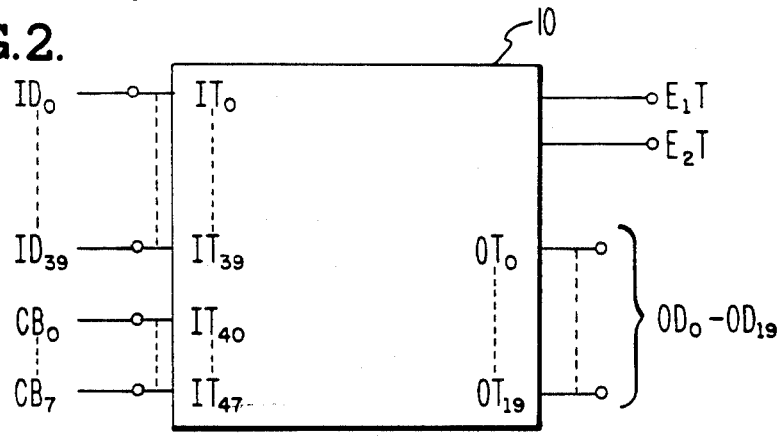
FIG.2.
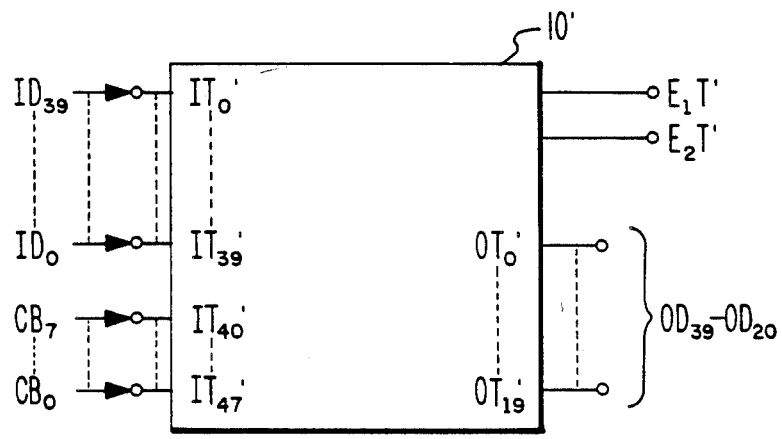

```
                    CHECK BITS                           CHECK BITS
                    CB₀ -CB₇                             CB₀ -CB₇
                  ⌒⎯⎯⎯⎯⎯⎯⎯⎯⌒                          ⌒⎯⎯⎯⎯⎯⎯⎯⎯⌒
                  7 6 5 4 3 2 1 0                        7 6 5 4 3 2 1 0

⎧  00 :=        X    X X              ⎧  21 := X   X     X
          ⎪  01 :=      X      X X              ⎪  22 := X   X   X
          ⎪  02 :=    X        X X              ⎪  23 := X     X X
          ⎪  03 :=  X          X X              ⎪  24 := X     X         X
          ⎪  04 :=        X  X   X              ⎪  25 := X     X       X
          ⎪  05 :=      X    X   X              ⎪  26 :=   X X X
          ⎪  06 :=    X      X   X              ⎪  27 :=     X X X
          ⎪  07 :=  X        X   X              ⎪  28 :=     X X       X
INPUT     ⎪  08 :=        X  X X                ⎪  29 :=     X X     X
DATA      ⎪  09 :=      X    X X         INPUT  ⎪  30 := X X         X
BITS      ⎨  10 :=    X    X X           DATA   ⎨  31 := X X       X
ID₀-ID₂₀  ⎪  11 :=  X        X X         BITS   ⎪  32 := X X             X
          ⎪  12 :=          X X X        ID₂₁-  ⎪  33 := X X           X
          ⎪  13 :=        X  X X         ID₃₉   ⎪  34 := X X         X
          ⎪  14 :=      X    X     X            ⎪  35 := X X       X
          ⎪  15 :=  X       X     X             ⎪  36 := X X             X
          ⎪  16 :=        X X   X               ⎪  37 := X X           X
          ⎪  17 :=      X X     X               ⎪  38 := X X         X
          ⎪  18 :=    X       X X               ⎩  39 := X X       X
          ⎪  19 :=  X         X X
          ⎩  20 :=    X   X   X
```

FIG.3B $$CB_0 = \oplus \left[ ID_0\text{-}ID_8, ID_{14}\text{-}ID_{15}, ID_{20}, ID_{24}, ID_{28}, ID_{32}, ID_{36} \right]$$

$$CB_1 = \oplus \left[ ID_0\text{-}ID_4, ID_8\text{-}ID_9, ID_{16}\text{-}ID_{19}, ID_{21}, ID_{25}, ID_{29}, ID_{33}, ID_{37} \right]$$

$$CB_2 = \oplus \left[ ID_4\text{-}ID_{13}, ID_{22}, ID_{26}, ID_{30}, ID_{34}, ID_{38} \right]$$

$$CB_3 = \oplus \left[ ID_{10}\text{-}ID_{19}, ID_{23}, ID_{27}, ID_{31}, ID_{35}, ID_{39} \right]$$

$$CB_4 = \oplus \left[ ID_0, ID_4, ID_8, ID_{12}, ID_{16}, ID_{20}\text{-}ID_{29} \right]$$

$$CB_5 = \oplus \left[ ID_1, ID_5, ID_9, ID_{13}, ID_{17}, ID_{26}\text{-}ID_{35} \right]$$

$$CB_6 \quad \oplus \left[ ID_2, ID_6, ID_{10}, ID_{14}, ID_{18}, ID_{20}\text{-}ID_{23}, ID_{30}\text{-}ID_{31}, ID_{36}\text{-}ID_{39} \right]$$

$$CB_7 = \oplus \left[ ID_3, ID_7, ID_{11}, ID_{15}, ID_{19}, ID_{24}\text{-}ID_{25}, ID_{32}\text{-}ID_{39} \right]$$

FIG. 4.

| INPUT DATA BITS $ID_0$–$ID_{16}$ | CB6 | CB5 | CB4 | CB3 | CB2 | CB1 | CB0 |
|---|---|---|---|---|---|---|---|
| 00 := | X | X |   | X |   |   |   |
| 01 := | X | X |   |   |   |   | X |
| 02 := | X | X |   |   | X |   |   |
| 03 := | X | X | X |   |   |   |   |
| 04 := | X |   | X | X |   |   |   |
| 05 := |   | X | X |   | X |   |   |
| 06 := | X |   | X |   |   | X |   |
| 07 := | X |   | X |   | X |   |   |
| 08 := |   | X | X |   |   |   | X |
| 09 := |   | X | X |   | X |   |   |
| 10 := |   | X | X | X | X |   |   |
| 11 := | X |   | X |   |   | X |   |
| 12 := |   |   |   | X | X | X |   |
| 13 := |   |   |   | X |   | X | X |
| 14 := |   |   | X | X |   |   | X |
| 15 := |   | X |   | X |   |   | X |
| 16 := | X |   |   | X |   | X |   |

| INPUT DATA BITS $ID_{17}$–$ID_{31}$ | CB6 | CB5 | CB4 | CB3 | CB2 | CB1 | CB0 |
|---|---|---|---|---|---|---|---|
| 17 := | X |   |   | X | X |   |   |
| 18 := | X | X |   | X |   |   |   |
| 19 := |   | X | X | X |   |   |   |
| 20 := |   |   | X |   | X |   | X |
| 21 := | X | X | X | X |   |   |   |
| 22 := |   | X |   |   | X | X |   |
| 23 := |   | X |   |   |   | X | X |
| 24 := |   | X |   | X |   |   | X |
| 25 := |   | X |   |   |   | X | X |
| 26 := |   |   | X |   | X | X |   |
| 27 := |   |   |   | X | X |   | X |
| 28 := |   |   |   |   | X | X | X |
| 29 := |   | X |   |   |   | X | X |
| 30 := |   | X |   |   |   | X | X |
| 31 := |   |   | X |   |   | X | X |

|  | | 0 1 2 7 6 5 4 3 | 0 0 0 0 | 1 0 0 0 | 0 1 0 0 | 1 1 0 0 | 0 0 1 0 | 1 0 1 0 | 0 1 1 0 |
|---|---|---|---|---|---|---|---|---|---|
| | | 0 0 0 0 | ✶ | 40 | 41 | D | 42 | D | D |
| | | 0 0 0 1 | 44 | D | D | 00 | D | 04 | 08 |
| | | 0 0 1 0 | 45 | D | D | 01 | D | 05 | 09 |
| | | 0 0 1 1 | D | 28 | 29 | D | 26 | D | D |
| | | 0 1 0 0 | 46 | D | D | 02 | D | 06 | M |
| | | 0 1 0 1 | D | 20 | 21 | D | 22 | D | D |
| | | 0 1 1 0 | D | M | M | D | 30 | D | D |
| | | 0 1 1 1 | M | D | D | M | D | M | M |
| | | 1 0 0 0 | 47 | D | D | 03 | D | 07 | M |
| | | 1 0 0 1 | D | 24 | 25 | D | M | D | D |
| | | 1 0 1 0 | D | 32 | 33 | D | 34 | D | D |
| | | 1 0 1 1 | M | D | D | M | D | M | M |
| | | 1 1 0 0 | D | 36 | 37 | D | 38 | D | D |
| | | 1 1 0 1 | M | D | D | M | D | M | M |
| | | 1 1 1 0 | M | D | D | M | D | M | M |
| | | 1 1 1 1 | D | M | M | D | M | D | D |

SYNDROME BIT $S_1$
SYNDROME BIT $S_6$
SYNDROME BIT $S_4$
SYNDROME BIT $S_5$

FIG.7B

```
1  0  1  0  1  0  1  0  1  ← SYNDROME BIT S₀
1  0  0  1  1  0  0  1  1  ← SYNDROME BIT S₁
1  0  0  0  0  1  1  1  1  ← SYNDROME BIT S₂
0  1  1  1  1  1  1  1  1  ← SYNDROME BIT S₃
_____
M  43 D  D  M  D  M  M  D
D  D  M  16 D  12 D  D  M
D  D  M  17 D  13 D  D  M
M  27 D  D  M  D  M  M  D
D  D  14 18 D  10 D  D  M
M  23 D  D  M  D  M  M  D
M  31 D  D  M  D  M  M  D
D  D  M  M  D  M  D  D  M
D  D  15 19 D  11 D  D  M
M  M  D  D  M  D  M  M  D
M  35 D  D  M  D  M  M  D
D  D  M  M  D  M  D  D  M
M  39 D  D  M  D  M  M  D
D  D  M  M  D  M  D  D  M
D  D  M  M  D  M  D  D  M
M  M  D  D  M  D  M  M  D
```

* = NO BITS IN ERROR
nn = SINGLE BIT IN ERROR, WHERE "nn" IS THE BAD BIT.
D = MULTIPLE ERRORS (EVEN NUMBER)
M = MULTIPLE ERRORS (ODD NUMBER)

NOTE THAT BITS 40 THRU 47 ARE THE CHECK BITS.

IC CHIP ERROR DETECTING AND CORRECTING METHOD

REFERENCE TO RELATED PATENT APPLICATION

My concurrently filed, commonly assigned, copending application Ser. No. 740,679 for "IC Chip Error Detecting and Correcting Apparatus" contains subject matter which is related to the present invention.

BACKGROUND OF THE INVENTION

This invention relates generally to improved apparatus and methods for implementing data processing operations in a data processing system, and particularly those data processing operations involving error checking and correction. Modern day data processing systems are typically implemented using integrated circuit (IC) chips. One of the problems presented by the use of IC chips is that the outputs provided by an IC chip are often limited in number and/or may have special restrictions with regard to their use. Gate array IC chips often are limited in this manner. For example, an IC chip might provide for 48 data inputs while providing a maximum of only 28 outputs. Furthermore, some of these outputs may be restricted, such as with regard to power handling capability.

When an IC chip provides an insufficient number of outputs, one possible solution is to employ two IC chips in a manner such that the required number of outputs are obtained by combining outputs from both IC chips. However, this use of two IC chips can have the disadvantageous result of requiring that the two IC chips have different designs because of differences in the functions they are to perform in response to the inputs applied thereto. This would typically be the case, for example, for error checking and correcting operations. It will be appreciated that increasing the number of differently designed IC chips which have to be provided can have a significant impact on the cost and complexity of the overall system.

One way of avoiding having to provide two differently designed chips where they perform differently is to include on each IC chip the capability of performing the functions required by both IC chips, the particular function to be performed by each IC chip in the system then being selected by applying a control signal to selection logic provided on the chip. However, the use of such an approach can significantly add to the cost and complexity of each such IC chip and could not in any event be employed for an IC chip which does not have sufficient logic to provide both functions.

SUMMARY OF THE INVENTION

Accordingly, a broad object of the present invention is to provide improved apparatus and methods for implementing data processing operations using IC chips.

Another object of the invention is to provide improved apparatus and methods for implementing error checking and/or correction operations on IC chips.

Still another object of the invention is to achieve one or more of the foregoing objects for an implementation in which a plurality of chips are used in order to provide sufficient outputs to accommodate processing results produced in response to input signal bits.

A further object of the invention in accordance with the foregoing object is to provide an implementation in which each of the plurality of IC chips has the same design.

A still further object of the invention in accordance with one or more of the foregoing objects is to provide for automatic verification of the operation of the error checking and/or correcting circuitry.

An additional object of the invention is to provide the implementations of the foregoing objects in a relatively simple and inexpensive manner.

The above objects are accomplished in a particular preferred embodiment of the invention in which 48 input bits (including 40 data bits and 8 check bits) are applied to two identical IC chips which use the check bits to detect errors, correct any single bit errors which may be detected, and provide 40 outputs (20 from each IC chip) respectively corresponding to the 40 input data bits. In addition, error indication outputs are also provided representing the results of the error checking.

In order to obtain the advantage of being able to employ two identical IC chips in this particular preferred embodiment, the 8 check bits are provided with values determined based on a specially chosen modified Hamming code having a predetermined symmetry, and the 48 inputs are wired in a different manner to each of the IC chips based on this predetermined symmetry so that the required, 40 data outputs are obtained (20 from each chip) even though each IC chip operates identically in response to its applied inputs.

The above summarized approach can also be extended to the performance of additional or other types of processing using a plurality of IC chips where the symmetry of the processing can be chosen in conjunction with the wiring of the input signals so that IC chips of like design can be used.

The specific nature of the invention as well as other objects, advantages, features, and uses thereof will become evident from the following description of a preferred embodiment in conjunction with the accompanying drawings.

BRIEF DESCRIPTION OF THE DRAWINGS

FIG. 1 is a schematic diagram illustrating the IC chip employed in the particular preferred embodiment of the invention described herein.

FIG. 2 illustrates the input and output wiring arrangements and designations employed for two identical IC chips of the type shown in FIG. 1 when used in a particular preferred embodiment of the invention.

FIG. 4 illustrates another example of an inversely symmetrical Hamming code.

Like numerals and characters refer to like elements throughout the figures of the drawings.

Figures 3, 3A:
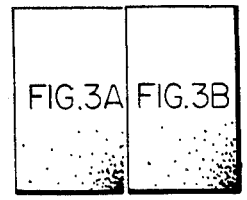
FIG. 3, comprised of FIGS. 3A and 3B, illustrates the specially chosen inversely symmetrical Hamming code employed in a particular preferred embodiment of the invention.

One well known way of detecting and correcting errors in data bits involves the use of an error code for generating check bits in response to the data bits. Typically, these check bits are included with the data bits and permit the detection and correction of one or more data errors depending on the type of code and the number of check bits provided. Data errors may occur, for example, after transmission of the data and check bits to other circuitry or another device. Further information with regard to error detecting and correcting can be found, for example, in the article by R. W. Hamming, "Error Detecting and Error Correcting Codes", *Bell Systems Technical Journal*, 29, 1950, pp. 147–160; and in U.S. Pat. No. 4,375,664, D. R. Kim, inventor.

For the purposes of the particular preferred embodiment to be described herein, the basic operations to be implemented will be assumed to be: (1) The detecting of the presence of one or more errors in a 48 bit input signal having 40 data bits and 8 check bits, wherein the 8 check bits have been generated in accordance with a Hamming type code, (2) the correction of a single bit error, (3) the provision of 40 correct output data bits where no error or only a single bit error is present, (4) the provision of 40 unchanged output bits where a multiple bit error is detected, and (5) the additional provision of error output signals indicating whether an error was detected and also whether the detected error was a single bit error or a multiple bit error. Although this assumed implementation example is rather specific, the description to be provided herein illustrating how the present invention provides for implementation of this assumed example will adequately demonstrate how the present invention may also be applied to other applications.

Initially, it is to be noted that the above described operations could readily be implemented in a conventional manner using a single IC chip if sufficient inputs and outputs were available. However, certain types of chips, such as a gate array chip (for example, the Motorola MCA 2500 ECL Macrocell Array chip), would not be able to provide sufficient outputs. It is assumed that such a type of gate array IC chip is to be used for the particular preferred embodiment being described, in which case two such gate array IC chips are employed to obtain sufficient outputs. The novel manner in which the particular preferred embodiment is designed in accordance with the invention to permit two identical ones of the gate array IC chips to be employed for implementing the functions summarized above will now be described.

Referring to FIG. 1, illustrated therein is a schematic diagram of a gate array IC chip 10 (such as a Motorola MCA 2500 ECL Macrocell Array chip) which has been designed to provide the error detecting and correcting operations set forth above for the particular preferred embodiment being described.

As shown in FIG. 1, the chip 10 provides 48 input terminals $IT_o$-$IT_{47}$ which are applied to error detecting and correcting circuitry 15. The error detecting and correcting circuitry 15 is designed to operate in a conventional manner to detect the presence of an error in the input signal bits applied to input terminals $IT_o$-$IT_{47}$, and for this purpose assumes that the 8 bits applied to input terminals $IT_{40}$-$IT_{47}$ are check bits. Circuitry 15 is also designed in a conventional manner to provide error indication signals SBE and MBE respectively indicating whether a single bit error or a multiple bit error was detected. These signals are applied to chip output terminals $E_1T$ and $E_2T$ as shown in FIG. 1.

The error detecting and correcting circuitry 15 illustrated in FIG. 1 is further designed to include the conventional capability of operating in response to a true or "1" SBE signal (indicating the detection of a single bit error) to correct the bit in error in the applied input signal. However, since each IC chip 10 need provide only 20 of the required 40 output signals in the particular preferred embodiment being described, the error detecting and correcting circuitry 15 is designed to provide for correcting a single bit error only if it occurs in one of the 20 input bits applied to input terminals $IT_o$-$IT_{19}$. As shown in FIG. 1, the resulting 20 output bits provided by the error detecting and correcting circuitry 15 are applied to the IC chip output terminals $OT_o$-$OT_{19}$. If there is no error in the 20 input bits applied to the 20 chip input terminals $IT_o$-$IT_{19}$, or if a multiple bit error is detected (MBE is true or "1") these 20 input bits are passed to the output terminals $OT_o$-$OT_{19}$ unchanged.

As further illustrated in FIG. 1, the IC chip 10 also includes a clock input terminal C and may also include other conventional inputs (not shown) for control and/or other purposes.

Next to be considered is the manner in which two identical ones of these IC chips shown in FIG. 1 are employed in the preferred embodiment in accordance with the invention to provide the previously set forth error detecting and correcting operations in response to an applied 48-bit input signal so as to produce the desired 40 output data bits. It has been discovered that the key to successfully achieving this result is to provide an implementation such that the manner in which the error detecting and correcting circuitry 15 on the chip 10 is caused to respond to the input bits is chosen in conjunction with the provision of different wiring arrangements for the input bits applied to each chip so that the composite outputs from the two IC chips provide the required outputs even though the two IC chips are the same.

The above described discovery is implemented in the particular preferred embodiment of the invention by specially choosing the response of the error detecting and correcting circuitry 15 on the IC chip 10 to the input bits so that: (1) For a first wiring arrangement of the input bits to the chip input terminals $IT_o$-$IT_{47}$, the resulting output bits produced at the 20 chip output terminals $OT_o$-$OT_{19}$ will correspond to 20 of the input data bits, and (2) for a second wiring arrangement of the input bits to the chip input terminals $IT_o$-$IT_{47}$, the resulting output bits produced at these 20 chip output terminals $OT_o$-$OT_{19}$ will correspond to the remaining 20 of the 40 required output bits. Thus, by employing two IC chips 10 and wiring the input bits to the input terminals $IT_o$-$IT_{47}$ of one IC chip using the first wiring arrangement, and wiring the input bits to the input terminals $IT_o$-$IT_{47}$ of the second IC chip using the second wiring arrangement, the resulting 40 output bits obtained from the 20 output bits provided by each IC chip at the chip output terminals $OT_o$-$OT_{19}$ will provide the required 40 output bits.

The specific manner in which the response of the errror detecting and correcting circuitry 15 on each chip 10 is chosen in conjunction with the first and second wiring arrangements of the 48 input bits to the chip input terminals of $IT_o$-$IT_{47}$ will now be described with reference to FIGS. 2–4. The chip wiring arrangements will be considered first with reference to FIG. 2. The reason why these particular wiring arrangements are chosen will become evident when the Hamming code response chosen for the error detecting and correcting circuitry 15 is considered in connection with FIG. 3.

As shown in FIG. 2, the lower IC chip 10' (which in the particular preferred embodiment is identical to the upper chip 10) and its associated components have been given the same numeral designations as used for the upper IC chip 10 with the addition of a prime (') for distinguishing purposes. It will be seen in FIG. 2 that the 48 input bits comprise the 40 input data bits $ID_o$-$ID_{39}$ and the associated 8 check bits $CB_o$-$CB_7$. For the uppper IC chip 10, the input data bits $ID_o$-$ID_{39}$ are applied to the chip input terminals $IT_o$-$IT_{39}$, respectively, and the associated check bits $CB_o$-$CB_7$ are applied to the chip input terminals $IT_{40}$-$IT_{47}$, respectively. For the lower IC chip 10', an inverse wiring arrangement is employed, the input data bits $ID_o$-$ID_{39}$ being applied to the chip input terminals $IT'_{39}$-$IT'_o$, respectively, and the associated input check bits $CB_o$-$CB_7$ being applied to the chip input terminals $IT'_{47}$-$IT'_{40}$, respectively. The desired 40 data output bits $OD_o$-$OD_{39}$ are then obtained from the composite of the 20 outputs produced by terminals $OT_o$-$OT_{19}$ of chip 10 and the 20 outputs produced by terminals $OT'_o$-$OT'_{19}$ of chip 10', wherein terminals $OT_o$-$OT_{19}$ provide data output bits $OD_o$-$OD_{19}$, respectively, and terminals $OT'_o$-$OT'_{19}$ provide data output bits $OD_{39}$-$OD_{20}$, respectively (note inverse order).

The basis for the choice of the wiring arrangements illustrated in FIG. 2 will now be described in connection with FIG. 3 which illustrates the special Hamming code chosen for the error detecting and correcting function, which in turn determines how the error detecting and correcting circuits (designated as 15 on IC chip 10 and 15' on IC 10') are connected to their respective chip input terminals $IT_o$-$IT_{39}$ and $IT'_o$-$IT'_{39}$.

FIG. 3 diagramatically illustrates the specially chosen Hamming code employed in the particular preferred embodiment being described by showing the encoding relationship between each of the eight input check bits $CB_o$-$CB_7$ and the 40 input data bits $ID_o$-$ID_{39}$. Each check bit is generated by EXCLUSIVE ORing the binary values of those input data bits marked with an "X" in the respective check bit column. The particular logical equations representing this FIG. 3 encoding relationship between the 8 input check bits $CB_o$-$CB_7$ and the 40 input data bits $ID_o$-$ID_{39}$ are set forth on the bottom of FIG. 3, wherein " + " represents an EXCLUSIVE OR operation.

It will be seen from FIG. 3 that the illustrated Hamming code is inversely symmetrical about its center—that is, the logical equations for check bits $CB_o$-$CB_3$ have the same pattern as for check bits $CB_7$-$CB_4$, respectively, except that the corresponding patterns for each check bit are in an inverse order relative to the input data bits $ID_o$-$ID_{39}$.

FIG. 3 illustrates an inversely symmetrical Hamming code for 40 data bits $IO_o$-$ID_{39}$ and an even number of check bits, namely check bits $CB_o$-$CB_7$. As another example, FIG. 4 illustrates an inversely symmetrical Hamming code (along with the corresponding logical equations) for 32 data bits $ID_o$-$ID_{31}$ and an odd number of check bits, namely the seven check bits $CB_o$-$CB_6$. In such a case, the pattern for the middle check bit $CB_3$ is chosen so that it is symmetrical relative to the data bits $ID_o$-$ID_{31}$ —that is (as shown in FIG. 4) it has the same pattern with respect to the upper 16 data bits $ID_o$-$ID_{15}$ as it does with respect to the lower 16 bits $ID_{31}$-$ID_{16}$.

It should now be understood that the choice of an inversely symmetrical Hamming code, such as illustrated in FIGS. 3 and 4, permits use of the identical designed IC chips 10 and 10' so long as the input data bits $ID_o$-$ID_{39}$ and the input check bits $CB_o$-$CB_7$ are inversely connected on the two IC chips and the data outputs $OD_o$-$OD_{39}$ are appropriately designated as shown in FIG. 3. In other words, by use of an inversely symmetrical Hamming code, the same error detecting and correcting circuitry can be used to detect and correct errors for both the upper and lower halves of the input bits. Therefore, by connecting the input data bits $ID_o$-$ID_{39}$ and the input check bits $CB_o$-$CB_7$ in inverse order relative to the IC chip input terminals as shown in FIG. 2, one chip 10 can be used to produce one-half of the data output bits ($OD_o$-$OD_{19}$) and the other chip 10' can be used to produce the other half of the data bits ($OD_{20}$-$OD_{39}$).

Further details will now be presented of a preferred construction and operation of the error detecting and correcting circuitry (indicated in FIG. 1 as 15 on chip 10). For this purpose, it will be assumed that, as shown in FIG. 2, there are 48 input bits of which the 40 bits $ID_o$-$ID_{39}$ are data bits and the 8 bits $CB_o$-$CB_7$ are check bits having values chosen in accordance with the inversely symmetrical Hamming code illustrated in FIG. 3.

Figure 5:
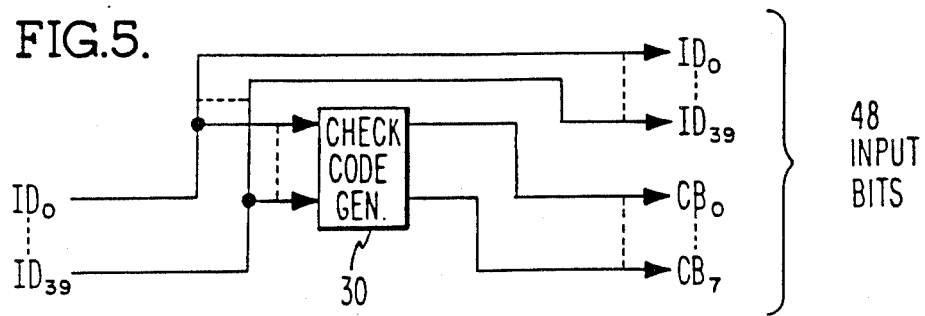
FIG. 5 is a schematic electrical diagram illustrating the generation of check bits for a plurality of data bits.

It will be understood that these eight check bits $CB_o$-$CB_7$ may be generated in a conventional manner in response to the data bits $ID_o$-$ID_{39}$, such as illustrated in FIG. 5. As shown in FIG. 5, the data bits $ID_o$-$ID_{39}$ are applied to a check code generator 30 which generates the check bits $CB_o$-$CB_7$ based on the equations set forth in FIG. 3. These check bits $CB_o$-$CB_7$ are then combined with the data bits $ID_o$-$ID_{39}$ to constitute the 48 input bits which are inversely applied to the input terminals $IT_o$-$IT_{47}$ and $IT'_o$-$IT'_{47}$ of IC chips 10 and 10' as shown in FIG. 2.

Figure 6:
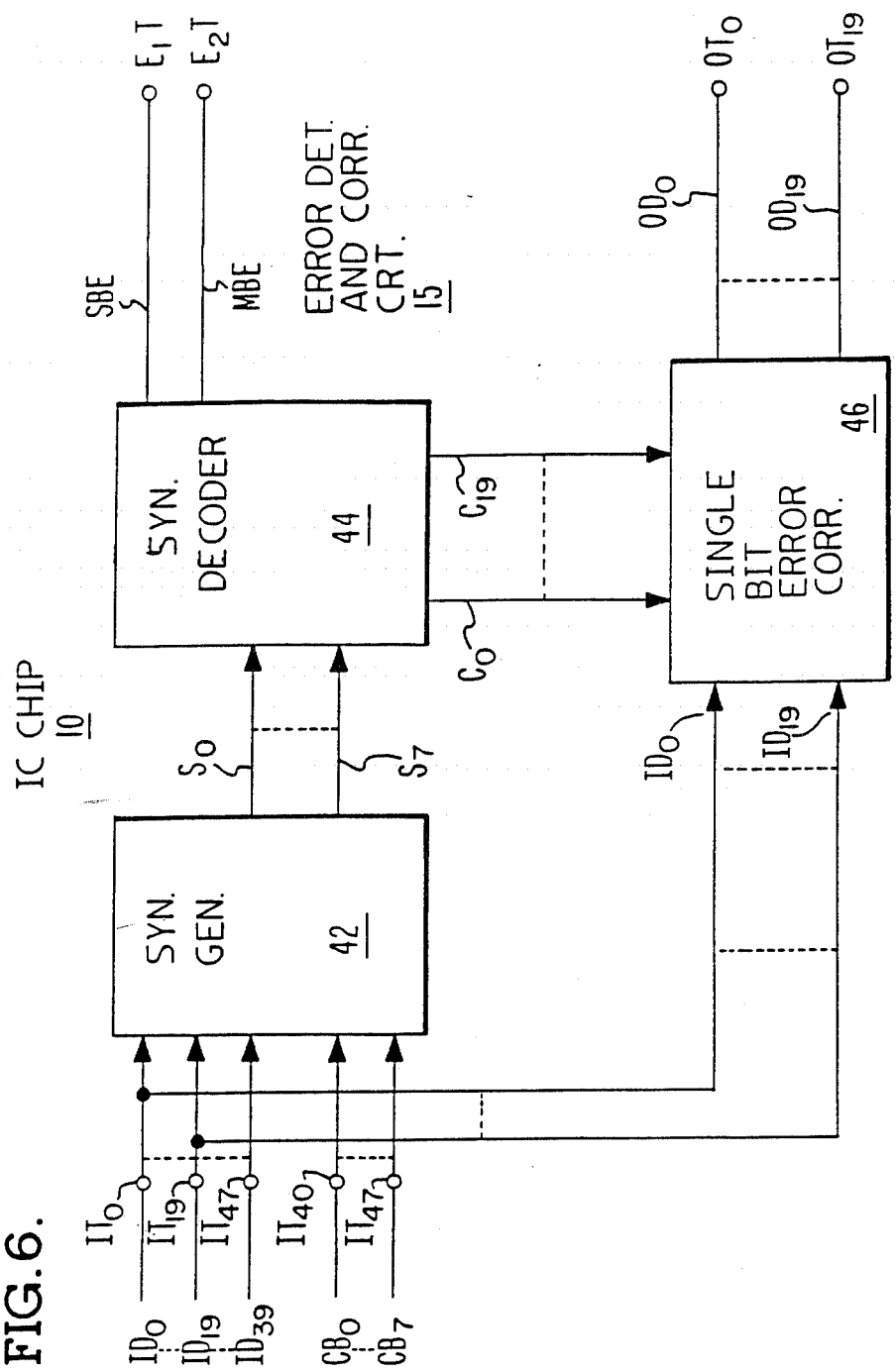
FIG. 6 is a schematic electrical diagram illustrating the operation of the error detecting and correcting circuitry provided on IC chip 10 in FIG. 2.

Referring next to FIG. 6, shown therein is an electrical block diagram illustrating a preferred implementation of detecting and correcting circuitry 15 and 15' of IC chip 10 and IC chip 10'. The operation indicated in FIG. 6 is for the input bit wiring arrangement of IC chip 10 shown in FIG. 2. The operational differences resulting from the inverse input bit wiring arrangement used for IC chip 10' will be described later.

As shown in FIG. 6, the error detecting and correcting circuitry comprises a syndrome generator 42, a syndrome decoder 44 and a single bit error corrector 46. The 40 input data bits $ID_o$-$ID_{39}$ are applied to input terminals $IT_o$-$IT_{39}$, respectively, of IC chip 10 and the 8 input check bits $CB_o$-$CB_7$ are applied to input terminals $IT_{40}$-$IT_{47}$, respectively. The chip input terminals $IT_o$-$IT_{47}$ containing both the data and check bits are coupled to the input of the syndrome generator 42, while the input terminals $IT_o$-$IT_{19}$ corresponding to the input data bits $ID_o$-$ID_{19}$, respectively, are also coupled to the input of the single bit error corrector 46. The syndrome generator 42 operates in a conventional manner in response to the input data bits $ID_o$-$ID_{39}$ to generate a second group of 8 check bits in accordance with the same inversely symmetrical Hamming code illustrated in FIG. 3, this second group of 8 check bits then being EXCLUSIVELY ORed with the 8 input check bits $CB_o$-$CB_7$ to produce 8 corresponding syndrome bits $S_o$-$S_7$ at the output of the syndrome generator 42.

As is well known, the values obtained for these syndrome bits $S_0$-$S_7$ provide error information with regard to the input data bits $ID_0$-$ID_{39}$ as well as the input check bits $CB_0$-$CB_7$.

Figures 7, 7A:
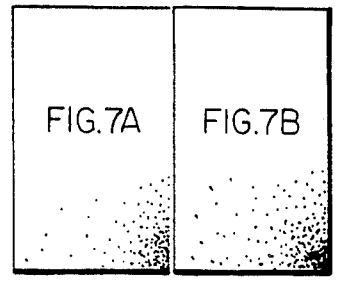
FIG. 7, comprised of FIGS. 7A and 7B, is a table indicating the meanings of particular values of the syndrome bits $S_0$–$S_7$ produced by the syndrome generator 42 in FIG. 6.

FIG. 7 is a table summarizing the meanings of the 256 possible combinational values of the 8 syndrome bits $S_0$-$S_7$ provided at the output of the syndrome generator 42 for the inversely symmetrical Hamming code illustrated in FIG. 3. As will be understood from FIG. 7, the all zero value 00000000 (indicated by "*") for 8 syndrome bits $S_0$-$S_7$ indicates that there are no bits in error in the input data bits $ID_0$-$ID_{39}$ or in the input check bits $ICB_0$-$ICB_7$. Single bit errors are indicated in FIG. 7 by the number of the bit in error. For example, a value of 10000011 for the syndrome bits $S_0$-$S_7$ shows a number "36" in FIG. 7, which indicates that there is a single bit error and that input data bit $ID_{36}$ is the bit in error.

Errors in the check bits $CB_0$-$CB_7$ are also shown in FIG. 7, these being indicated by the numbers 40-47, respectively, which are a result of the input check bits $CB_0$-$CB_7$ being connected to input terminals $IT_{40}$-$IT_{47}$ of IC chip 10 as shown in FIG. 2. For example, a value of 00010000 for the syndrome bits $S_0$-$S_7$ shows the number "43" which indicates that there is a single bit error and that check bit $CB_3$ (which is applied to input terminal $IT_{43}$ of chip 10) is the bit in error.

Multiple bit errors are indicated in FIG. 7 by "M" and "D", "M" indicating that there are an odd number of bits in error, and "D" indicating that there are an even number of bits in error.

Returning to FIG. 6, it will be seen that the syndrome bits $S_0$-$S_7$ produced at the output of the syndrome generator 42 are applied to a syndrome decoder 44 which operates to decode particular ones of the combinational values of the syndrome bits $S_0$-$S_7$, depending on which of the FIG. 7 indications are to be employed. In the particular preferred embodiment being described herein, the syndrome decoder 44 provides a single bit error output signal SBE and a multiple bit error output signal MBE for application to corresponding output terminals $E_1T$ and $E_2T$ as shown in FIG. 1. It will be understood from FIG. 7 that the decoding provided by the syndrome decoder 44 is such that SBE will be true or "1" if the input syndrome bits $S_0$-$S_7$ have values corresponding to any of the single bit error indications (numbers 00 to 47) in FIG. 7, while the MBE signal will be true or "1" if the syndrome bits $S_0$-$S_7$ have values corresponding to any of the "M" or "D" indications in FIG. 7.

It will be remembered that each of the IC chips 10 and 10' need provide only one-half of the required data outputs, as shown in FIG. 2. Accordingly, each chip provides for correcting single bit errors for only one half of the input data bits $ID_0$-$ID_{39}$, these being the input data bits connected to input terminals $IT_0$-$IT_{19}$. Accordingly, in order to provide for correcting half or 20 of the input data bits $ID_0$-$ID_{39}$, the syndrome decoder 44 additionally provides 20 correcting bits $C_0$-$C_{19}$ which are applied to the single bit errror corrector 46 along with the input data bits connected to chip input terminals $IT_0$-$IT_{19}$, which for chip 10 are input data bits $ID_0$-$ID_{19}$, respectively. The outputs of the error corrector 46 will thus correspond to output data bits $OD_0$-$OD_{19}$. (The manner in which IC chip 10' provides for correcting the remaining input data bits $ID_{20}$-$ID_{39}$ will be explained shortly.)

The operation of the syndrome decoder 44 in FIG. 6 in producing the correcting bits $C_0$-$C_{19}$ is such that, if a single bit error is detected, a correcting bit will be true or "1" if its corresponding input data bit is the one which is in error. For example, if a single bit error is detected and the bit in error is input data bit $ID_{14}$, then correcting signal $C_{14}$ will be true or "1". If there are no errors in any of the input data bits $ID_0$-$ID_{19}$, or if there is a multiple bit error, then all of the correcting bits $C_0$-$C_{19}$ will be false or "0".

The single bit error corrector 46 in FIG. 6 thus passes the applied input data bits $ID_0$-$ID_{19}$ unchanged unless the single bit error signal SBE is "true" or "1", in which case the data bit in error is converted by the error corrector 46. This may be accomplished, for example, simply by EXCLUSIVE ORing the corresponding data and error bits. For example, if correcting signal $C_{14}$ is a "1", indicating an error in input data bit $ID_{14}$, then the value of $OD_{14}$ at the output of the error detector 46 will be the inverse of $ID_{14}$—that is, if $ID_{14}$ applied ot the error detector 46 is "0", then $OD_{14}$ will be "1", and if $ID_{14}$ is "1", $ID_{14}$ will be "0".

Figure 8:
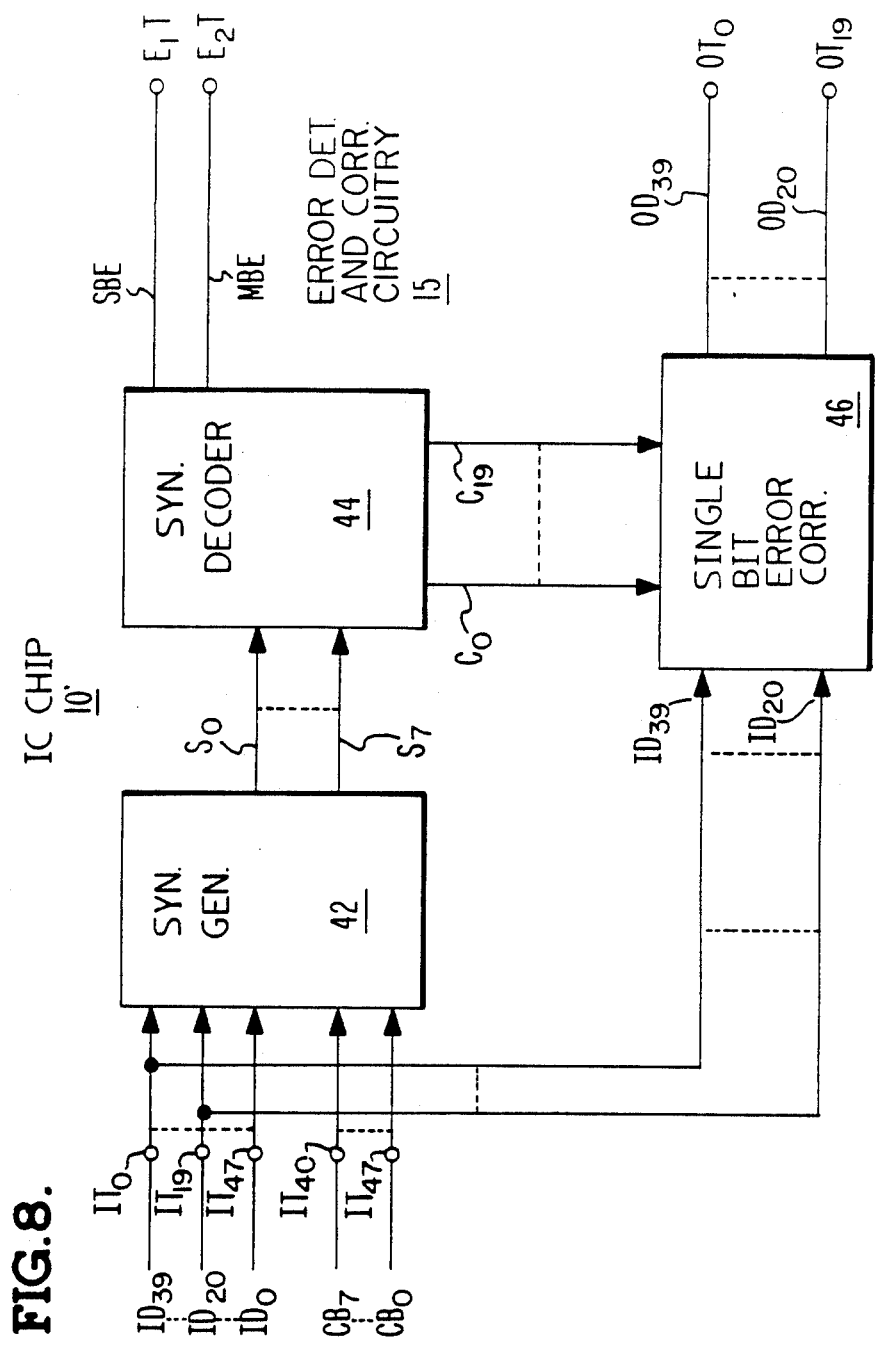
FIG. 8 is a schematic electrical diagram illustrating the operation of the error detecting and correcting circuitry provided on IC chip 10' in FIG. 2.

From the description of FIG. 6 provided above, it should now be understood how IC chip 10 in FIG. 2 produces the output data bits $OD_0$-$OD_{19}$ at chip output terminals $OT_0$-$OT_{19}$. The manner in which the IC chip 10' produces the remaining output data bits $OD_{20}$-$OD_{39}$ will now be explained with reference to FIG. 8 which is the same as FIG. 6, except for differences in the input and output data bit designations resulting from the inverse wiring employed for the input data bits applied to IC chip 10' as shown in FIG. 2. Thus, the error corrector 46 will provide output data bits $OD_{39}$-$OD_{19}$ which are respectively applied to the output terminals $OT'_0$-$OT'_{19}$ of chip 10' and, together with the output data bits $OD_0$-$OD_{19}$ produced by IC chip 10, provide the 40 required output data bits $OD_0$-$OD_{39}$.

It will also be understood with respect to IC chip 10', the signals $C_0$-$C_{19}$ produced by the syndrome decoder 44 in response to the syndrome bits $S_0$-$S_6$ produced by the syndrome generator 42 will properly indicate the presence of errors in input data bits $ID_{39}$-$ID_{20}$, respectively (as well as single and multiple bit errors) because of the inverse wiring of the input data bits $ID_0$-$ID_{39}$ and input check bits $CB_0$-$CB_7$ to the input terminals $IT'_0$-$IT'_{47}$ terminals, as shown in FIG. 2, coupled with the use of the inversely symmetrical Hamming code shown in FIG. 3. This will become evident by noting that, for chip 10', the input data bits $ID_0$-$ID_{39}$ and the input check bits $CB_0$-$CB_7$ are applied to the syndrome generator 42 in an inverse manner relative to chip 10. Thus the syndrome generation and coding operations performed by chip 10 with respect to input data bits $ID_0$-$ID_{39}$ will be performed in the same manner for chip 10' with respect to the input data bits $ID_{39}$-$ID_0$ since the Hamming code is inversely symmetrical, as shown in FIG. 3. Furthermore, the error correcting operations performed with respect to input data bits $ID_0$-$ID_{19}$ for chip 10 will be the same as performed with respect to input data bits $ID_{39}$-$ID_{20}$, respectively, of chip 10'. Thus, output data bits $ID_0$-$ID_{19}$ will be produced at output terminals $OT_0$-$OT_{19}$, respectively, of chip 10 while output data bits $ID_{39}$-$ID_{20}$ will be produced at output terminals $OT'_0$-$OT'_{19}$, respectively, of chip 10'.

Although the present invention has been described in connection with a particular preferred embodiment, it is to be understood that many modifications and variations may be provided in the structure, arrangement and use thereof without departing from the true spirit of the inventive contribution.

For example, although the particular preferred embodiment of the invention described herein does not provide for correcting or outputting any check bits, it will be understood that this could readily be provided in basically the same manner as provided for the data input bits, in which case, each IC chip would additionally provide 4 of the 8 output check bits.

It will also be understood that the present invention is not limited to use for data and correcting operations, but could also be employed for other types of processing operations where an appropriate cooperative relationship can be provided between the input wiring arrangements and the chip response capability. Furthermore, the invention could also be employed with more than two IC chips.

Accordingly, the present invention is to be considered as including all possible modifications and variations coming within the scope of the invention as defined in the appended claims.

What is claimed is:

1. A method employing integrated circuit chips for providing a predetermined processing of a plurality of input signals for producing a plurality of required output signals, wherein said input signals comprise input data bits and input check bits, and wherein said input check bits have values determined based on an inversely symmetrical Hamming code, said method comprising:

providing first and second integrated circuit chips of of like design, each chip having a predetermined plurality of chip input terminals which is of sufficient number to receive all of said input signals, a predetermined plurality of chip output terminals which is of insufficient number to provide all of said required output signals, and a predetermined chip processing capability for processing signals applied to the chip input terminals and for producing signals in response thereto at the chip output terminals; and coupling said input signals to the chip input terminals of said integrated circuit chips in a different predetermined manner for each chip and processing the thus coupled inputs to said chips in a manner such that each chip produces different ones of said required output signals at its output terminals, the composite of the signals produced at the chip output terminals of said plurality of integrated circuit chips providing said required output signals;

said processing including performing error detecting and correcting operations on each chip in response to the input bits coupled thereto based on said inversely symmetrical Hamming code.

2. The invention in accordance with claim 1, wherein said first and second predetermined responses have a predetermined symmetrical relationship relative to one another.

3. The invention in accordance with claim 1, wherein the coupling of the input signals corresponding to said input data bits to the chip input terminals of one of said chips is the inverse of the coupling thereof to the chip input terminals of the other of said chips.

4. The invention in accordance with claim 3, wherein the input signals corresponding to said input check bits are also inversely coupled with respect to the chip input terminals of said chips.

5. The invention in accordance with claim 1, wherein the coupling of said input data bits and said input check bits to the chip input terminals of said chips is such that the error detecting and correcting performed by one of said chips operates to correct at least one predetermined type of error in a first group of said input signals and the error detecting and correcting performed by the other chip provides for correcting at least one predetermined type of error in a second and different group of said input signals, and wherein the error detecting and correcting performed by both chips leaves correct input signals unchanged.

6. The invention in accordance with claim 5, including the step of coupling the results of said error detecting and correcting performed by each of said chips to the chip output terminals.

7. The invention in accordance with claim 6, wherein the composite outputs provided at the chip output terminals of said chips constitute said required output signals.

* * * * *

UNITED STATES PATENT AND TRADEMARK OFFICE
CERTIFICATE OF CORRECTION

PATENT NO. : 4,739,504
DATED : April 19, 1988
INVENTOR(S) : Duane W. Leslie

It is certified that error appears in the above-identified patent and that said Letters Patent is hereby corrected as shown below:

Col. 2, line 26, change "required," to --required--.
Col. 5, line 50, change ""+"" to -- "$\oplus$" --.
Col. 8, line 12, change "converted" to --corrected--;
      line 18, change "ot" to --to--;
      line 20, change "$ID_{14}$", second occurrence, to --$OD_{14}$--.

Signed and Sealed this

Twenty-third Day of August, 1988

Attest:

DONALD J. QUIGG

*Attesting Officer*      *Commissioner of Patents and Trademarks*